United States Patent
Kon

(10) Patent No.: US 8,115,377 B2
(45) Date of Patent: Feb. 14, 2012

(54) ORGANIC EL LIGHT SOURCE

(75) Inventor: Shusaku Kon, Tokyo (JP)

(73) Assignee: NEC Lighting, Ltd., Tokyo (JP)

( * ) Notice: Subject to any disclaimer, the term of this patent is extended or adjusted under 35 U.S.C. 154(b) by 56 days.

(21) Appl. No.: 12/818,403

(22) Filed: Jun. 18, 2010

(65) Prior Publication Data
US 2011/0025198 A1 Feb. 3, 2011

(30) Foreign Application Priority Data
Jul. 28, 2009 (JP) ................................. 2009-175130

(51) Int. Cl.
H01L 33/58 (2010.01)
H01L 51/50 (2010.01)
H01L 51/52 (2010.01)

(52) U.S. Cl. ........ 313/501; 313/506; 313/512; 313/110; 257/98

(58) Field of Classification Search .......... 313/498–512, 313/110–112; 257/98–100
See application file for complete search history.

(56) References Cited

U.S. PATENT DOCUMENTS

| | | | |
|---|---|---|---|
| 6,946,788 B2 * | 9/2005 | Suehiro et al. | 313/498 |
| 7,458,704 B2 * | 12/2008 | Naoi | 362/330 |
| 7,784,958 B2 * | 8/2010 | Nakagome | 362/97.2 |
| 2004/0114066 A1 | 6/2004 | Takeuchi et al. | |
| 2004/0119402 A1 * | 6/2004 | Shiang et al. | 313/506 |
| 2004/0150329 A1 * | 8/2004 | Asai et al. | 313/506 |
| 2004/0211971 A1 * | 10/2004 | Takei et al. | 257/98 |

FOREIGN PATENT DOCUMENTS
EP 1426790 A1 6/2004
JP 2004205849 A 7/2004

OTHER PUBLICATIONS

European Search Report for EP 10 16 9772 completed May 12, 2011.
B. W. D'Andrade et al., "Organic light-emitting device luminaire for illumination applications", Applied Physics Letters 88, 2006, pp. 192908-1-3.

* cited by examiner

Primary Examiner — Mariceli Santiago

(57) ABSTRACT

A translucent material substrate is shaped such that high luminous efficiency can be obtained in an organic EL light source in which light is emitted from a translucent material substrate to the atmosphere. The organic EL light source includes a luminescent layer composed of an organic luminescent element, a transparent electrode and a counter electrode, and a translucent material substrate. The translucent material substrate has a truncated quadrangular pyramidal shape having a surface in abutment with the luminescent layer as the bottom face of the shape. The bottom face is formed in the shape of a square in which the length of one side is "b", and the top face opposite the bottom face is formed in the shape of a square in which the length of one side with respect to the same extending direction as that of the "b"-length side is "a". In addition, the shape of the translucent material substrate has thickness "c". The translucent material substrate is shaped so that a ratio (a/b) of length a of a side of the top face to length b of a side of the bottom face in the same extending direction as that of the side is 0.3 or higher but not higher than 0.95, and that a ratio (b/c) of length b of a side of the bottom face to the thickness c of the translucent material substrate is 10 or lower.

4 Claims, 4 Drawing Sheets

ORGANIC EL LIGHT SOURCE

This application is based upon and claims the benefit of priority from Japanese patent application No. 2009-175130, filed on Jul. 28, 2009, the disclosure of which is incorporated herein in its entirety by reference.

BACKGROUND OF THE INVENTION

1. Field of the Invention

The present invention relates to an organic EL (electroluminescence) light source. Note that an organic EL element is also referred to as an OLED (Organic Light-Emitting Diode).

2. Description of the Related Art

An organic EL light source is superior in response since the time taken from electrical conduction to light emission is extremely short. In addition, the light source has the characteristics in which the response thereof is almost free from variation with temperature and the view angle thereof is close to 180°. Unlike a liquid crystal device that does not emit light by itself, the organic EL light source does not need any backlight and can be made thin and lightweight. For these reasons, the organic EL light source has been a focus of attention in recent years as a device for use in a display unit that is an alternative to a liquid crystal display device and for use in lighting applications.

FIG. 1 is a cross-sectional view illustrating a configuration of commonly-used organic EL light source 9. As illustrated in FIG. 1, luminescent layer 4, which is a principal part of organic EL light source 9, includes organic luminescent element 1 which, when electrified, emits light, transparent electrode 2 having optical transparency, and counter electrode 3 having light reflectivity. In addition, organic luminescent element 1 is disposed between transparent electrode 2 and counter electrode 3 to configure luminescent layer 4. Furthermore, translucent material substrate 5 for fixing luminescent layer 4 is provided on a surface of transparent electrode 2 opposite a surface thereof with which organic luminescent element 1 has contact.

In organic EL light source 9, luminescence takes place in organic luminescent element 1 that has a higher refractive index than the atmosphere. The light thus emitted propagates through transparent electrode 2, translucent material substrate 5, and the atmosphere in this order. The refractive indexes of these mediums generally decrease in the order of organic luminescent element 1, transparent electrode 2, translucent material substrate 5 and the atmosphere, though this depends on the raw materials used for the respective mediums.

When advancing from a high-refractive index medium to a low-refractive index medium, the light may not in some cases pass through a boundary face therebetween, thus causing total reflection. Total reflection occurs if an incidence angle formed by a normal line of the boundary face and incident light is larger than a certain angle (generally referred to as a critical angle). Total reflection follows Snell's law, and the critical angle becomes smaller with the increase of a refractive index difference between two mediums, thus causing the range of incidence angles at which total reflection occurs to become wider.

In organic EL light source 9, the refractive index difference is largest between translucent material substrate 5 and the atmosphere. Consequently, some portion of light emitted by organic luminescent element 1 is confined within translucent material substrate 5 due to total reflection. The efficiency at which light emitted by organic luminescent element 1 is output to the outside (hereinafter referred to as "luminous efficiency") is said to be only about 20% to 30%.

In addition, a liquid crystal display device or a lighting device, which draws attention as an application of organic EL light source 9, is in many cases viewed by a user from the front side of the device. It is therefore desirable that the front side luminance of the device be high. Accordingly, it has been a challenge to improve luminous efficiency and to enhance the front side luminance in order to effectively utilizing organic EL light source 9.

Hence, JP2004-184792A (hereinafter referred to as Patent Document 1) and JP2004-233957A (hereinafter referred to as Patent Document 2) disclose a method for improving luminous efficiency by use of luminance-enhancing film 14 formed of such transparent resin as illustrated in FIG. 2. FIG. 2 is a cross-sectional view when luminance-enhancing film 14 is fixed onto conventional organic EL light source 9. Luminance-enhancing film 14 is provided on a surface of translucent material substrate 5 opposite a surface thereof with which luminescent layer 4 has contact. The refractive index of luminance-enhancing film 14 is lower than that of translucent material substrate 5 but higher than that of the atmosphere. As a result, a critical angle at a boundary face between translucent material substrate 5 and luminance-enhancing film 14, is larger than a critical angle at a boundary face between translucent material substrate 5 and the atmosphere. Consequently, even light having such an incidence angle as to cause the light to be totally reflected at the boundary face between translucent material substrate 5 and the atmosphere, and therefore, to be not emitted from translucent material substrate 5, can enter from translucent material substrate 5 into luminance-enhancing film 14. Accordingly, a larger amount of light is emitted to the outside through luminance-enhancing film 14.

As illustrated in FIG. 2, luminance-enhancing film 14 includes entrance plane 10 having a planar surface and having contact with translucent material substrate 5 and exit plane 11 having a plurality of convex portions on a surface of luminance-enhancing film 14 opposite entrance plane 10. On the top end of each convex portion in exit plane 11, there are formed top face 12 parallel with entrance plane 10 and inclined plane 13 tilted with respect to entrance plane 10, so as to reduce the size of the area toward the top end.

Accordingly, even light L3, whose incidence angle exceeds a critical angle at top face 12, decreases below the critical angle at inclined plane 13 and can thus be made to transmit through luminance-enhancing film 14 (light L4). As a result, the luminous efficiency of organic EL light source is improved.

However, use of the luminance-enhancing film in order to improve the luminous efficiency of an organic EL light source may add an expense for the luminance-enhancing film and a step of bonding the film to the translucent material substrate, thus increasing the cost of the light source. In addition, there is the possibility that the luminous efficiency of the organic EL light source degrades due to damage to the luminance-enhancing film or the peeling off thereof.

Hence, JP3991862B (hereinafter referred to as Patent Document 3) discloses a technique for improving luminous efficiency without using any luminance-enhancing film. In Patent Document 3, the shape of the luminance-enhancing film in Patent Document 1 or Patent Document 2 is formed in the translucent material substrate to reduce the amount of light to be confined within the translucent material substrate, thereby enhancing luminous efficiency. However, although Patent Document 3 mentions a truncated pyramidal shape, a curved shape, a triangular shape, and the like whereby a light-emitting plane has the convex shape of the translucent material substrate, the document does not show any specific dimensional examples of the shape.

Patent Document 2 discloses the shape of each convex portion of the luminance-enhancing film, specifically the area ratio of the top face of the convex portion to the bottom face of the convex portion, and a range of angles formed by the normal line of the entrance plane and the inclined plane. However, these dimensional data items merely mean a range of shapes of the luminance-enhancing film. Thus, the document does not show any range of shapes when convex portions are provided in the translucent material substrate.

SUMMARY OF THE INVENTION

Hence, an object of the present invention is to provide a shape of a translucent material substrate whereby high luminous efficiency can be obtained in an organic EL light source in which light is emitted from the translucent material substrate to the atmosphere. The translucent material substrate, as referred to in the invention as claimed herein, includes not only a substrate alone made of a translucent material but also a substrate including a base plate made of a translucent material and a transparent body placed in optical contact with the base plate.

In order to achieve the aforementioned object, an organic EL light source of the present invention includes a luminescent layer which, when electrified, emits light; and a truncated quadrangular pyramidal shaped translucent material substrate including a bottom face onto which the luminescent layer is fixed and a top face opposite the bottom face, wherein a ratio of the length of a side of the top face to the length of at least one side of the bottom face with respect to the same extending direction as that of the side is 0.3 or higher but not higher than 0.95, and a ratio of the length of a side of the bottom face to the thickness of the translucent material substrate is 10 or lower.

According to the present invention, it is possible to obtain high luminous efficiency in the organic EL light source in which light is emitted from the translucent material substrate to the atmosphere.

The above and other objects, features and advantages of the present invention will become apparent from the following description with reference to the accompanying drawings which illustrate examples of the present invention.

DETAILED DESCRIPTION OF THE PREFERRED EMBODIMENTS

Hereinafter, exemplary embodiments will be described in detail according to the accompanying drawings.

Figure 1:
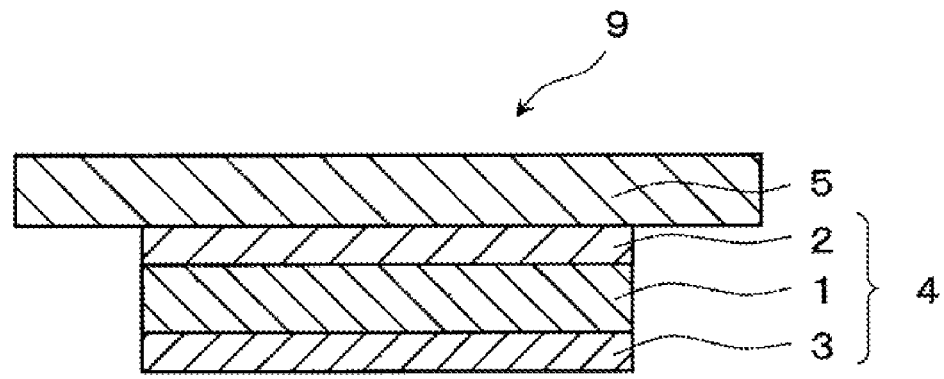
FIG. 1 is a cross-sectional view illustrating a configuration of a conventional organic EL light source.
Figure 2:
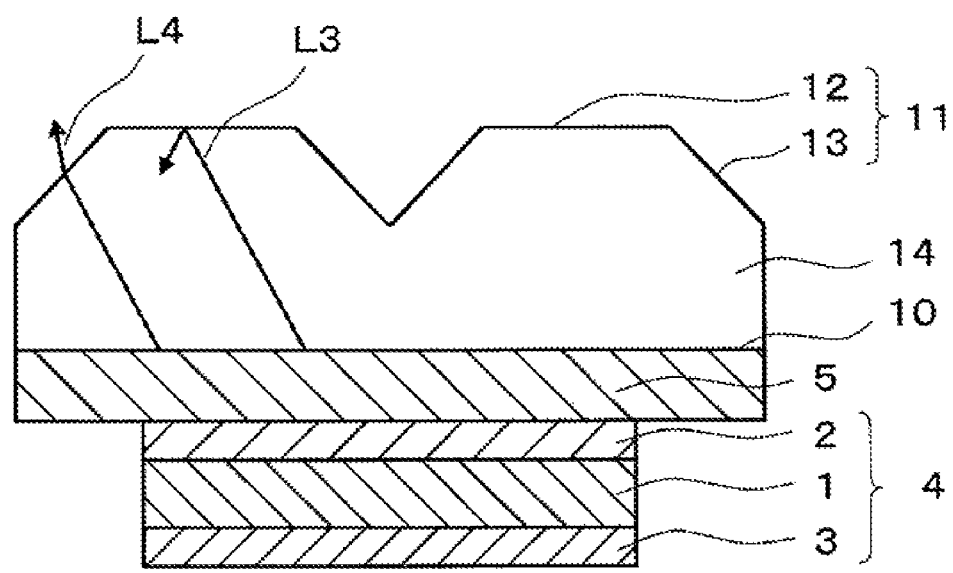
FIG. 2 is a cross-sectional view when a luminance-enhancing film is fixed onto the conventional organic EL light source.
Figure 3:
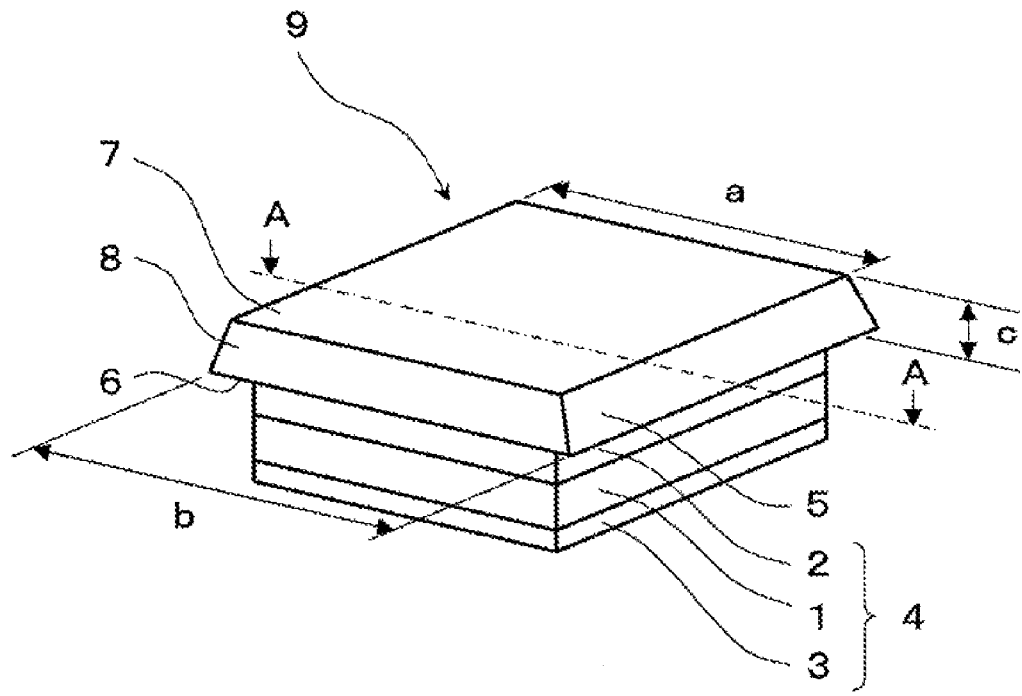
FIG. 3 is a perspective view illustrating a configuration of an organic EL light source in one exemplary embodiment.
Figure 4:
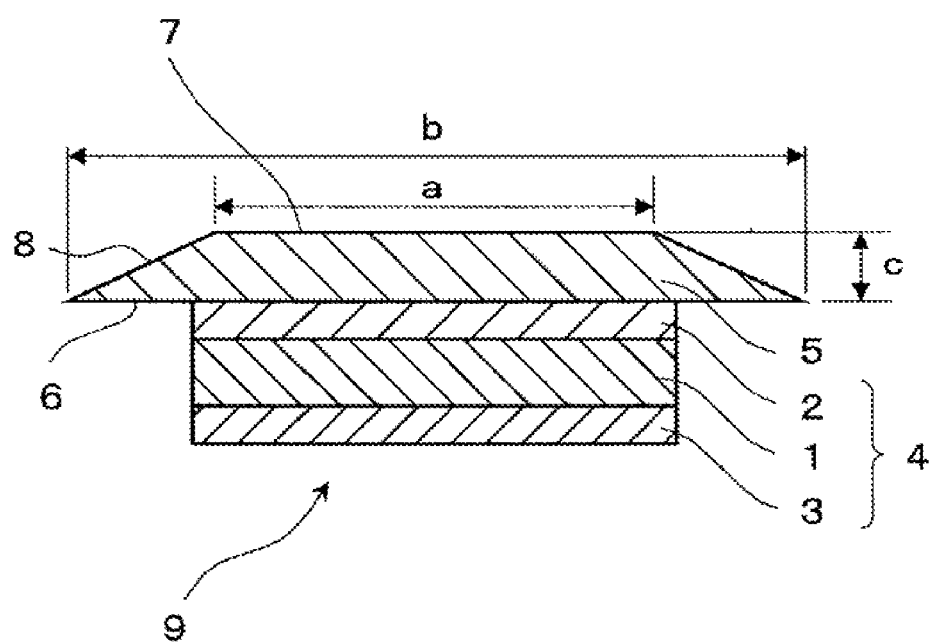
FIG. 4 is a cross-sectional view illustrating the configuration of the organic EL light source.

FIG. 3 is a perspective view illustrating a configuration of an organic EL light source 9 in one exemplary embodiment, and FIG. 4 is a cross-sectional view of the organic EL light source 9 taken along the line A-A of FIG. 3. Like conventional organic EL light source 9 illustrated in FIG. 1, organic luminescent element 1 which, when electrified, emits light by itself is provided in luminescent layer 4. Transparent electrode 2 is disposed on one surface of organic luminescent element 1, and counter electrode 3 is provided on a surface of organic luminescent element 1 opposite the surface on which transparent electrode 2 of organic luminescent element 1 is provided. In addition, translucent material substrate 5 for fixing luminescent layer 4 is provided on a surface of transparent electrode 2 opposite a surface thereof with which organic luminescent element 1 has contact.

Generally, ITO (Indium Tin Oxide) having optical transparency is used for transparent electrode 2 and aluminum having light reflectivity is used for counter electrode 3. In addition, transparent high-transmissivity resin, such as a polycarbonate or glass composed primarily of silicon oxide ($SiO_2$), is used as translucent material substrate 5.

In the exemplary embodiments, organic EL light source 9 is configured using ITO as transparent electrode 2, aluminum as counter electrode 3, and glass as translucent material substrate 5.

A user of organic EL light source 9 generally uses the light source by viewing it from a direction perpendicular to organic luminescent element 1 and along an extension of the direction on a side on which transparent electrode 2 is disposed. That is, the front side luminance of organic EL light source 9 of the present invention is enhanced by providing a course for light emitted from organic luminescent element 1 directed toward a direction perpendicular to organic luminescent element 1 and toward a side on which transparent electrode 2 is disposed.

In an exemplary embodiment, translucent material substrate 5 has a truncated quadrangular pyramidal shape, as illustrated in FIG. 3, and includes bottom face 6 in contact with transparent electrode 2, top face 7 opposite bottom face 6 of translucent material substrate 5, and side surface 8 which connects opposite sides of bottom face 6 and top face 7. Bottom face 6 is a square b in length of a side, and top face 7 is a square a in length of a side with respect to the same extending direction as that of the b-long side of bottom face 6 (where, a is smaller than b). In addition, the thickness of translucent material substrate 5 (distance between bottom face 6 and top face 7) is c.

Subsequently, a mechanism for enhancing luminous efficiency in the present invention will be described using FIGS. 5 and 6.

Figure 5:
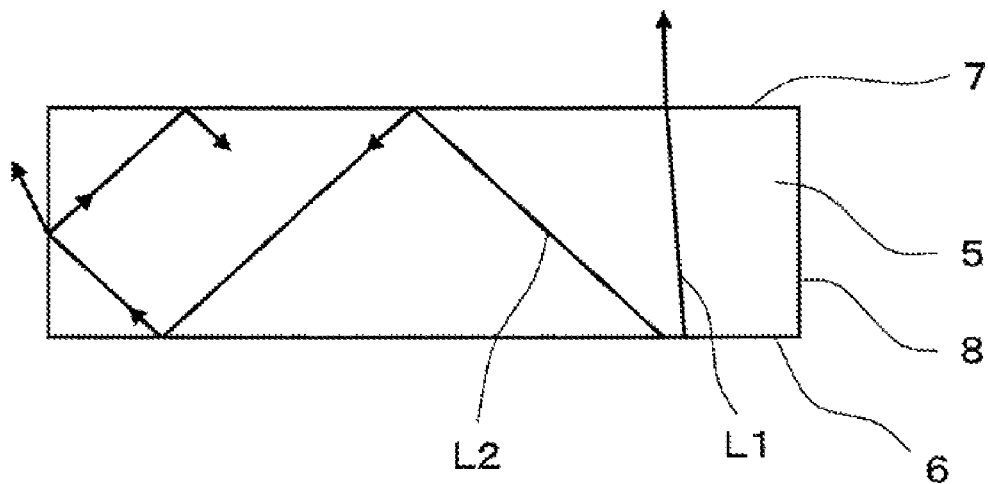
FIG. 5 is a schematic view used to explain the reflection of light in a shape of a conventional translucent material substrate.
Figure 6:
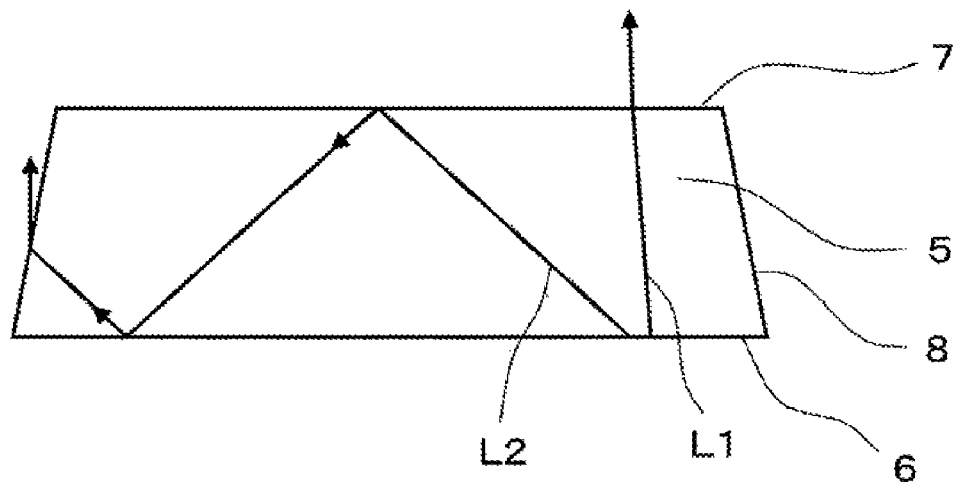
FIG. 6 is a schematic view used to explain the reflection of light in a shape of a translucent material substrate of the present invention.

FIG. 5 is a schematic view used to explain courses of light within conventional translucent material substrate 5, whereas FIG. 6 is a schematic view used to explain courses of light within translucent material substrate 5 of the present invention.

In organic EL light source 9 illustrated in FIG. 3, luminescence takes place in organic luminescent element 1 (approximately 1.7 in refractive index) whose refractive index is higher than the atmosphere. The light thus emitted propagates toward lower-refractive index mediums in the order of transparent electrode 2 (approximately 1.6 in refractive index), translucent material substrate 5 (approximately 1.5 in refractive index), and the atmosphere (approximately 1.0 in refractive index). The refractive index difference is largest between translucent material substrate 5 and the atmosphere, and therefore, the total reflection is liable to occur therebetween. That is, light emitted by organic luminescent element 1 is easy to become confined within translucent material substrate 5.

As illustrated in FIGS. 5 and 6, the incidence angle of light L1 having a course almost perpendicular to bottom face 6 of translucent material substrate 5 is smaller than a critical angle when light L1 passes through top face 7. Therefore, light L1 is emitted out of translucent material substrate 5 without being totally reflected at top face 7.

However, the incidence angle of light L2 having a course inclined to some degree with respect to bottom face 6 of translucent material substrate 5 is larger than the critical angle when light L2 passes through top face 7. Therefore, light L2 is totally reflected at top face 7. In addition, light L2, after being totally reflected at top face 7, advances to bottom face 6 with the incidence angle at top face 7 maintained as is, and therefore, enters bottom face 6 at the same incidence angle. Consequently, light L2 forms a course within translucent material substrate 5 while maintaining the same angle also at bottom face 6. After that, total reflection likewise occurs at top face 7 even if light L2 once again reaches top face 7. Thus, light L2 is not emitted out of translucent material substrate 5.

If light L2 repeats total reflection and reaches side surface 8, the incidence angle at side surface 8 differs in value from the incidence angle at top face 7. In conventional translucent material substrate 5 illustrated in FIG. 5, if the incidence angle of light L2 at side surface 8 is larger than a critical angle, total reflection also occurs at side surface 8 and light L2 once again reaches top face 7. Since the incidence angle of light L2 at top face 7, which is totally reflected at side surface 8, is equal to the incidence angle at top face 7 before light L2 is totally reflected at side surface 8, the incidence angle is larger than the critical angle. Thus, total reflection occurs at top face 7. That is, light L2 repeats total reflection within translucent material substrate 5 and disappears without being emitted to the outside. Consequently, luminous efficiency decreases.

If the incidence angle of light L2 at side surface 8 is smaller than the critical angle, light L2 passes through side surface 8 and is emitted out of translucent material substrate 5. However, light L2 emitted from side surface 8 does not advance in a direction perpendicular to top face 7. Consequently, light L2 emitted from side surface 8 does not behave in such a manner as to enhance the front side luminance of organic EL light source 9.

On the other hand, emitted light behaves as described below within translucent material substrate 5 of the present invention illustrated in FIG. 6.

Light L2 having repeated total reflection within translucent material substrate 5 reaches side surface 8. If the incidence angle of light L2 at side surface 8 is smaller than the critical angle, then light L2 is emitted from side surface 8. In addition, as illustrated in FIG. 6, the light emitted from side surface 8 is refracted in a direction perpendicular to top face 7. Thus, the light behaves in such manner as to enhance the front side luminance.

Since side surface 8 is inclined with respect to bottom face 6, the incidence angle of light L2 at side surface 8 is smaller than an incidence angle formed when translucent material substrate 5 is shaped as illustrated in FIG. 5. This means that a range of angles, at which total reflection occurs, becomes narrower in this case than in the case of the shape of conventional translucent material substrate 5. Consequently, the amount of light confined within translucent material substrate 5 is reduced, and therefore, luminous efficiency is enhanced.

Subsequently, the difference in luminous efficiency due to the difference in the shape of translucent material substrate 5 is determined by means of simulation. The truncated quadrangular pyramid illustrated in FIG. 3 was used as the shape of translucent material substrate 5 for which simulation was performed. The simulation was performed using a ray tracking method.

Figure 7:
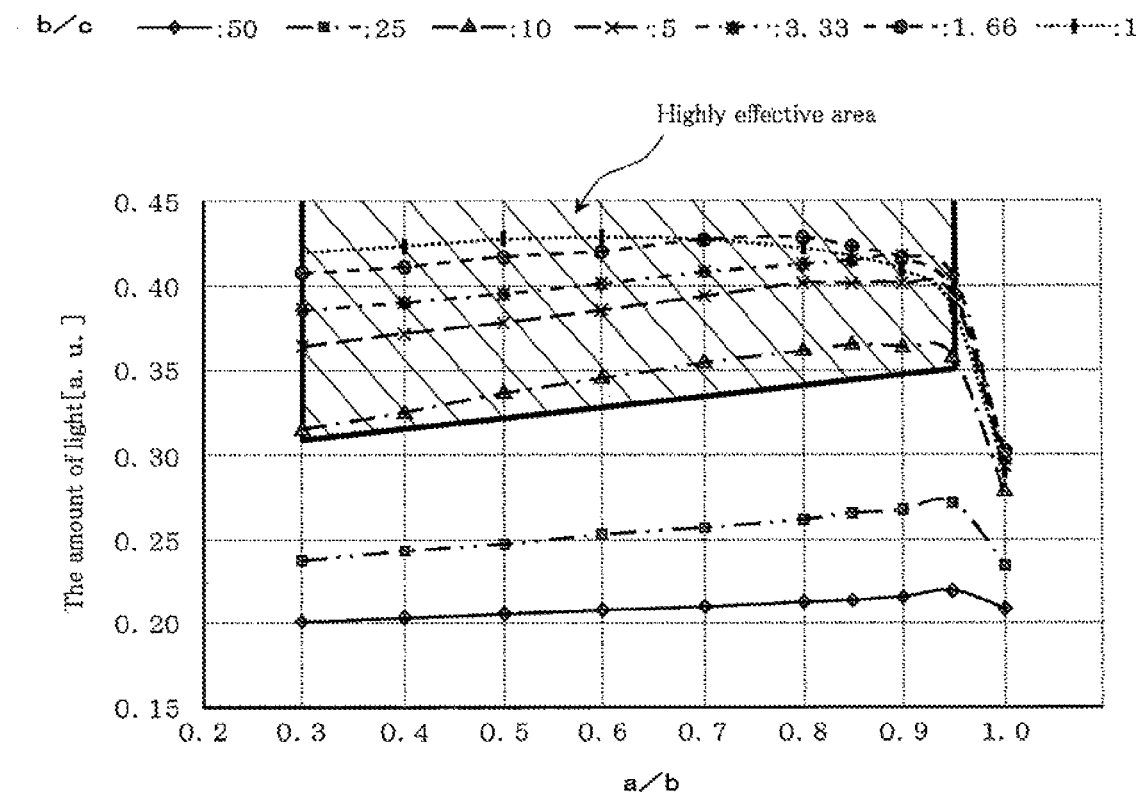
FIG. 7 is a graphical view illustrating the variation of luminous efficiency when simulation is performed using the shape of the translucent material substrate of the present invention.

FIG. 7 is a graphical view illustrating the results of the simulation. In FIG. 7, a variation in the amount of light derived from organic EL light source 9 when one atomic unit of light is emitted from organic luminescent element 1 is shown on the axis of ordinates, and a ratio (a/b) of length a of a side of top face 7 to length b of a side of bottom face 6 with respect to the same extending direction as that of the a-long side is shown on the axis of abscissas.

In addition, FIG. 7 shows variations in the amount of light when ratios (b/c) of length b of a side of bottom face 6 to the thickness of translucent material substrate 5 are 50, 25, 10, 5, 3.33, 1.66, and 1, as denoted respectively by a solid line, a long-dashed two-dotted line, a long-dashed one-dotted line, a long-dashed line, a dashed-dotted line, a dashed line, and a dotted line.

From the results shown in FIG. 7, it is understood that if a ratio (a/b) of length a of a side of top face 7 of translucent material substrate 5 to length b of a side of bottom face 6 is 0.3 or higher but not higher than 0.95, then luminous efficiency is improved, compared with a case in which translucent material substrate 5 is a rectangular solid. It is also understood that if a ratio (b/c) of length b of a side of bottom face 6 of translucent material substrate 5 to the thickness c of translucent material substrate 5 is 10 or lower, then luminous efficiency is also improved.

A lower limit of the ratio (b/c) of length b of a side of bottom face 6 to the thickness c of translucent material substrate 5 is not defined in particular here. In order to reduce the ratio b/c, length b of a side of bottom face 6 is decreased or the thickness c of translucent material substrate 5 is increased. Reducing length b of a side of bottom face 6 means decreasing the emission area of organic EL light source 9, thus running contrary to the requirement for increasing the size of a liquid crystal display device or a lighting device. In addition, increasing the thickness c of translucent material substrate 5 means thickening organic EL light source 9, thus running contrary to the requirement for reducing the thickness and weight of the liquid crystal display device or the lighting device. Accordingly, the lower limit is determined by taking into consideration the emission area, the weight and the like of organic EL light source 9.

As has been described heretofore, according to the exemplary embodiments, it is possible to obtain satisfactory luminous efficiency in a translucent material layer in which convex portions inclined with respect to an entrance plane are provided.

The same advantageous effect as described above can also be obtained even if bottom face 6 and top face 7 of translucent material substrate 5 are rectangular. Furthermore, although a truncated quadrangular pyramidal shaped substrate was used to simulate the shape of translucent material substrate 5 and luminous efficiency, the same advantageous effect can also be obtained even if translucent material substrate 5 has a truncated conical shape. If translucent material substrate 5 has a truncated conical shape, the same relationship as that of FIG. 7 can be obtained by defining the radius of top face 7 as a and the radius of bottom face 6 as b.

Luminous efficiency can also be improved by forming translucent material substrate 5 into a rectangular-solid base plate and placing a truncated quadrangular pyramidal shaped transparent body in optical contact with top face 7 of translucent material substrate 5 formed as the base plate. If material having a refractive index close to the refractive index of glass used for translucent material substrate 5 is used as the transparent body and the transparent body is placed in optical contact with translucent material substrate 5, total reflection does not occur at the boundary face between translucent material substrate 5 and the transparent body. Examples of materials for such a transparent body as described above include acrylics and polycarbonates.

The same relationship as that of FIG. 7 can also be obtained for shapes of the transparent body in which high luminous efficiency is obtained. In this case, b corresponds to the length of a side of the bottom face of the transparent body, and a corresponds to the length of a side of the top face of the transparent body with respect to the same extending direction as that of the b-long side of the bottom face of the transparent body. In addition, c corresponds to the thickness of the transparent body.

Note that the optical contact of the transparent body with the base plate made of a translucent material substrate can be achieved by bonding the transparent body using resin or the like having a refractive index close to those of the translucent material substrate and the transparent body.

While preferred embodiments of the present invention have been described using specific terms, such description is for illustrative purposes only, and it is to be understood that changes and variations may be made without departing from the spirit or scope of the following claims.

What is claimed is:

1. An organic EL light source comprising:
   a luminescent layer which, when electrified, emits light; and
   a truncated quadrangular pyramidal shaped translucent material substrate including a bottom face onto which the luminescent layer is fixed and a top face opposite the bottom face,
   wherein a ratio of the length of a side of the top face to the length of at least one side of the bottom face with respect to the same extending direction as that of the side is 0.3 or higher but not higher than 0.95, and a ratio of the length of a side of the bottom face to the thickness of the translucent material substrate is 10 or lower.

2. The organic EL light source according to claim 1, wherein the translucent material substrate is made of glass.

3. The organic EL light source according to claim 1, wherein the translucent material substrate includes a base plate made of a translucent material and a transparent body placed in optical contact with the base plate.

4. The organic EL light source according to claim 3, wherein the transparent body is made of an acrylic or a polycarbonate.

* * * * *